US 6,606,264 B2

(12) United States Patent
Blodgett

(10) Patent No.: US 6,606,264 B2
(45) Date of Patent: Aug. 12, 2003

(54) PROGRAMMABLE CIRCUIT AND ITS METHOD OF OPERATION

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/977,288

(22) Filed: Oct. 16, 2001

(65) Prior Publication Data

US 2002/0018362 A1 Feb. 14, 2002

Related U.S. Application Data

(63) Continuation of application No. 09/618,459, filed on Jul. 18, 2000, now Pat. No. 6,327,178.

(51) Int. Cl.[7] .............................................. G11C 17/12
(52) U.S. Cl. ........................ 365/177; 365/694; 365/104
(58) Field of Search .......................... 365/94, 103, 104, 365/177; 326/35, 36, 44

(56) References Cited

U.S. PATENT DOCUMENTS

| | | | |
|---|---|---|---|
| 4,333,164 A | | 6/1982 | Orikabe et al. .............. 365/104 |
| 4,384,345 A | | 5/1983 | Mikome ..................... 365/104 |
| 4,605,872 A | | 8/1986 | Rung ......................... 327/525 |
| 4,720,816 A | * | 1/1988 | Matsuoka et al. ........... 365/104 |
| 4,937,787 A | * | 6/1990 | Kobatake .................... 365/104 |
| 5,303,184 A | * | 4/1994 | Noda .......................... 365/104 |
| 5,426,605 A | * | 6/1995 | Van Berkel et al. ........ 365/104 |
| 5,448,187 A | | 9/1995 | Kowalski ..................... 326/81 |
| 5,745,401 A | * | 4/1998 | Lee ............................. 365/104 |
| 5,768,191 A | * | 6/1998 | Choi et al. .............. 365/185.03 |
| 5,831,894 A | | 11/1998 | Chang ........................ 365/104 |
| 5,834,813 A | | 11/1998 | Ma et al. .................... 257/368 |
| 5,835,406 A | | 11/1998 | Chevallier et al. ...... 365/185.03 |
| 5,838,040 A | | 11/1998 | Salter, III et al. ........... 257/321 |
| 5,862,074 A | * | 1/1999 | Park ....................... 365/185.03 |
| 5,886,925 A | | 3/1999 | Campardo et al. ....... 365/185.2 |
| 5,896,316 A | | 4/1999 | Toyoda ................. 365/185.28 |
| 5,907,517 A | | 5/1999 | Komarek et al. ........... 365/210 |
| 6,044,006 A | | 3/2000 | Von Basse et al. ......... 365/104 |
| 6,178,114 B1 | | 1/2001 | Yang ....................... 365/185.2 |

OTHER PUBLICATIONS

Troutman, R.R., Abstract No. B79017617, C79012689, FET programmable read–only memory, IBM Technical Disclosure Bulletin, vol. 21, No. 4, pp. 1374–1376, Sep. 1978.

"FET Programmable Read Only Memory", IBM Technical Disclosure Bulletin, pp. 1374–1376, Sept. 1978.

* cited by examiner

Primary Examiner—Tan T. Nguyen
(74) Attorney, Agent, or Firm—Dickstein Shapiro Morin & Oshinsky LLP

(57) ABSTRACT

A programmable circuit and its method of operation are disclosed in which a transistor is used as a programmable element. The transistor may be programmed to one of two different gate threshold voltage values for operation. During reading of the transistor, a gate threshold voltage between the two values is applied and the status of the transistor as on or off is determined to determine the program state of the transistor. The program state of the transistor can be determined by a simple latch circuit.

17 Claims, 3 Drawing Sheets

PROGRAMMABLE CIRCUIT AND ITS METHOD OF OPERATION

This is a continuation of application Ser. No. 09/618,459 filed Jul. 18, 2000 now U.S. Pat. No. 6,327,178.

One of the ways to implement a programmable feature on an integrated circuit is by utilizing fuses or antifuses. Fuses are selectively electrically programmed by applying a program voltage which opens a circuit between two conductive terminals of the fuse. For laser fuses, a laser is used to cut a fuse link. An antifuse is electrically programmed by applying a programming voltage to break down dielectric material connected to two conductive terminals of the antifuse.

The programming voltage permanently changes either the fuse or antifuse to provide a high or low resistance in accordance with the programming. In the case of an antifuse, the high resistance is typically a program resistance on the order of hundreds of thousand ohms.

The programming voltage for a fuse or antifuse is typically quite high, for example, over 8 volts. This high voltage must be routed to selective fuse or antifuse elements on an integrated circuitry without affecting other highly sensitive lower voltage signal paths. Accordingly, the introduction of high fuse or antifuse programming voltages requires careful design and process modifications, such as tailored junction profiles or thick gate oxides in order to avoid damage to other sensitive components on the integrated circuit die. This increases fabrication complexity as well as chip size.

A programmable circuit which relies on a lower programming voltage and decreased die area for the programmable element would be desirable.

Also, in the testing of DRAM memory devices utilizing boosted wordline voltages, a Vt shift of several hundred millivolts has inadvertently been produced in small n-channel transistors in the memory array. This causes the affected memory cells to be inferior since the data to be stored in the cell is not as readily transferred through the affected n-channel access device. To avoid this detrimental effect, device manufacturing processes have been modified. This invention utilizes this effect which is detrimental to the memory array, for an improved programmable circuit element outside of the memory array.

SUMMARY OF THE INVENTION

The present invention provides a programmable circuit which relies on a programmable transistor in which the gate threshold voltage for turning the transistor on is programmable. The gate threshold voltage may be programmed to be either a first voltage or a second voltage. The program state of the transistor can be determined by applying a gate threshold voltage between the first and second gate threshold voltages and then determining the operative state, i.e.; on or off, of the transistor.

One of the first and second gate threshold voltages for the transistor can be selected as the normal gate threshold operating voltage for the transistor, while the other gate threshold voltage can be set by applying suitable voltages to the gate and drain electrodes of the transistor to thereby alter the gate threshold voltage to a second value away from the normal gate threshold voltage. The programming voltage for the gate and drain are lower than voltage typically used to program a fuse or antifuse element.

The programming circuit of the invention has particular utility in any integrated circuit which requires a programmable element and has particular utility in the field of DRAMs as a replacement for a fuse or antifuse element.

The above advantages and features of the invention will be more clearly understood from the following detailed description which is provided in connection with the accompanying drawings.

DETAILED DESCRIPTION OF THE PREFERRED EMBODIMENTS

Figure 1:
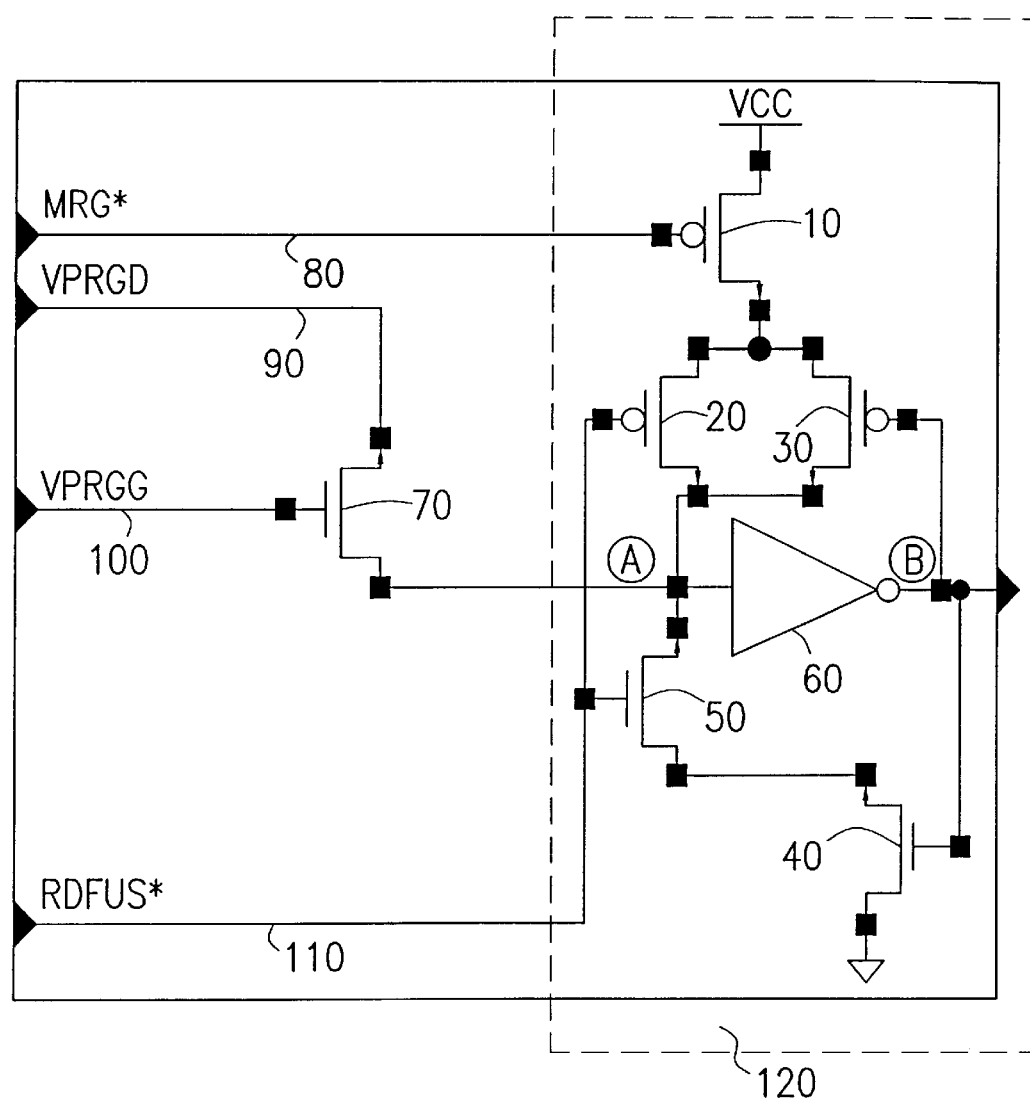
FIG. 1 illustrates a programmable circuit in an exemplary embodiment of the invention.
Figure 2:
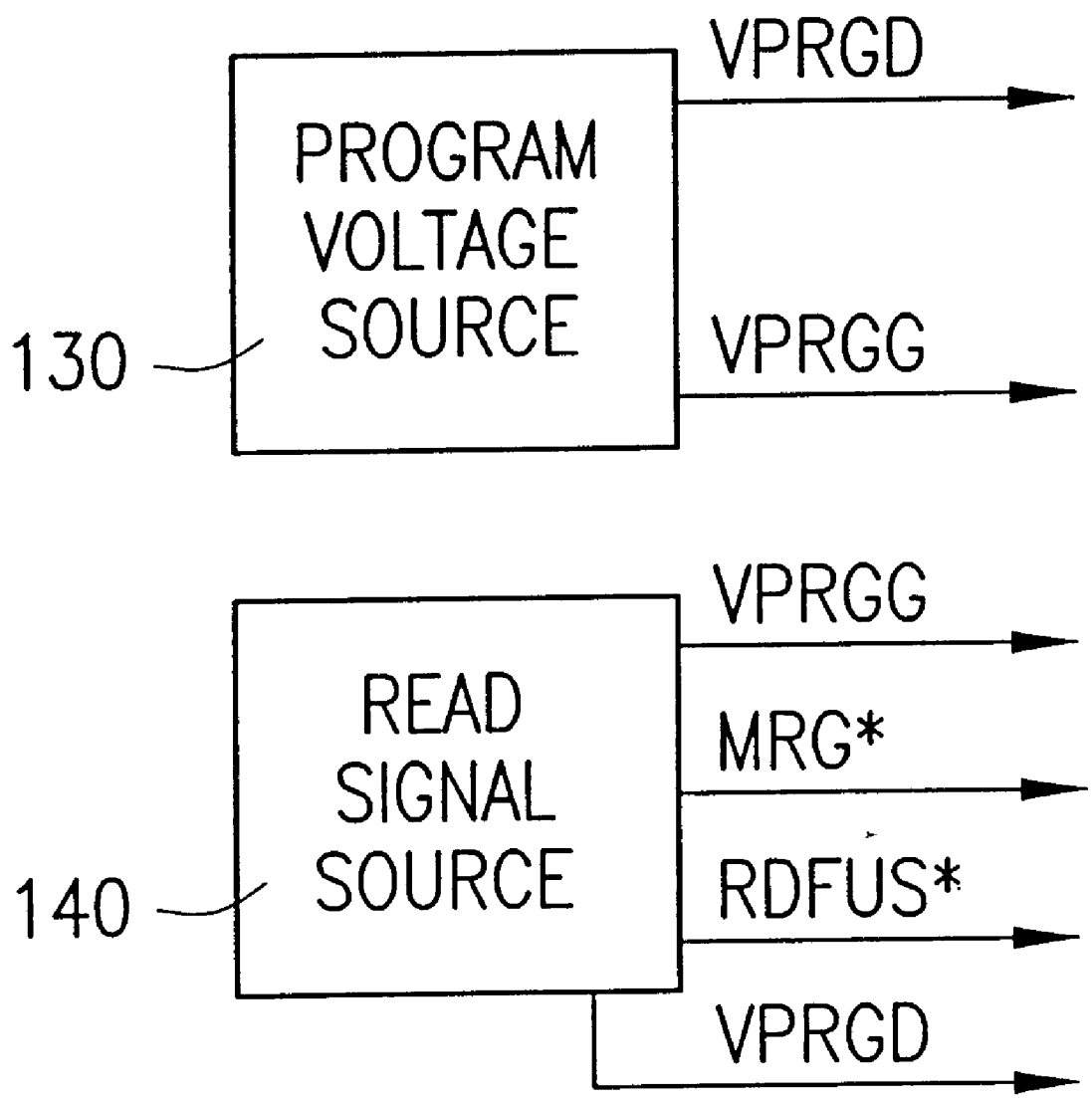
FIG. 2 illustrates signal sources for providing the operative signals for the FIG. 1 circuit.

An exemplary embodiment of the invention is illustrated in FIGS. 1 and 2. FIG. 1 illustrates a programmable transistor 70 illustrated as an n-channel transistor which has its gate coupled to a programming signal line VPRGG 100 and its drain coupled to another programming signal line VPRGD 90. As fabricated, transistor 70 has a normal gate operating threshold voltage Vt, e.g. 0.7 v. The gate threshold operating voltage Vt can be changed by programming on the signal lines 90 and 100. For example, if the normal-gate threshold Vt for transistor 70 is 0.7 v, the application of a programming voltage on the signal lines 90 and 100 to the drain and gate terminals respectively can change this threshold voltage Vt to another higher value, e.g. 1.5 v.

If, for example, 6 volts is applied to the gate via signal line 100, and 4.5 volts is applied to the drain via signal line 90, and a substrate bias voltage Vbb in which the circuit of FIG. 1 is fabricated is lowered from a value in the range of −0.6 to −1.0 volts, to a value of −2.0 volts, and this condition is maintained for approximately 5 seconds, the threshold voltage Vt of transistor 70 will permanently shift to approximately 1.5 volts. It is thought that this shift in threshold voltage is caused by charges being trapped in the gate of transistor 70 by the noted programming conditions. Accordingly, the gate threshold voltage of transistor 70 can remain at the original threshold voltage level Vt or can be programmed to a different substantially higher voltage level, e.g., approximately 2 Vt, thus establishing two possible gate threshold voltages for transistor 70.

The programmed state of programmable transistor 70, that is, whether it is operating with the initial gate threshold voltage Vt or with a substantially higher gate threshold voltage, can be determined by grounding line 90 and applying a gate threshold voltage on line 100, which is between the normal threshold voltage Vt and the higher gate threshold voltage, and then determining whether the transistor 70 is "on" or "off." If the transistor 70 was set at its normal voltage threshold Vt, a higher voltage threshold applied to the gate of transistor 70 on line 100 will cause transistor 70 to turn "on.". Likewise, if the voltage threshold for programmable transistor 70 has been changed to a higher value, then when a threshold voltage on line 100, which is between the original value Vt and the higher value, is applied, transistor 70 will remain "off" when line 90 is grounded. Thus, programmable transistor 70 provides a simple and convenient way of programming a programmable element which does not require the same magnitude of programming voltages as is required with a fuse or antifuse device.

FIG. 1 further illustrates a latch circuit 120 which is used to determine whether transistor 70 is "on" or "off," thus determining the state to which transistor 70 was programmed. Latch circuit 120 includes an input node A and an output node B, with the output node B supplying a signal indicating the program state of programmable transistor 70.

Input node A is connected to the source terminal of transistor 70, and an inverter 60 is connected between input node A and output node B of latch circuit 120. Latch circuit 120 further includes two p-channel transistors 20 and 30, with the sources of transistors 20 and 30 connected together and the drains of transistors 20 and 30 connected together. The sources of transistors 20 and 30 are, in turn, coupled to a voltage source Vcc through another p-channel transistor 10. The drains of transistors 20 and 30 are connected to node A.

Latch circuit 120 also includes two n-channel transistors 50 and 40 which are serially connected with the source of transistor 50 being connected to the drain of transistor 40, and with the transistors 40 and 50 being in turn serially connected between node A and ground. The gates of transistors 30 and 40 are connected to the output node B, while the gates of transistors 20 and 50 are connected to a read fuse RDFUS* (* denotes an active "low signal" line) signal line 110. Transistor 10 has its gate connected to a test margin control signal line MRG* 80.

FIG. 2 illustrates a program voltage source 130 which supplies signals to the VPRGD and VPRGG signal lines 90 and 100, respectively for programming transistor 70, and a read signal source 140 which supplies signals on the lines VPRGD, VPRGG, MRG* and RDFUS*, that is, to lines 90, 100, 80 and 110, respectively.

The programmable signal source 130 is operative to program transistor 70 to set the higher threshold voltage as needed or desired. Program voltage source 130 can be resident on an integrated circuit substrate containing the FIG. 1 circuit, or may be an external source which controls application of the programming signals on lines 90 and 100 via external terminals of the integrated circuit. Transistor 70 can be programmed during a testing state of an integrated circuit or, if external terminals of a packaged device are used to control the signals for lines 90, 100, by a user of the integrated circuit.

The read signal source 140 is resident on the integrated circuit containing the FIG. 1 circuit and provides the signals VPRGD, VPRGG, MRG* and RDFUS* during a read operation to ascertain the status of transistor 70. In particular, a gate threshold voltage is applied to the line VPRGG 100, which is between the original gate threshold voltage Vt and the higher threshold voltage which is set when programming signals are previously applied on lines 90 and 100, as described above. For example, if the higher gate threshold is approximately 2 Vt, when the applied gate threshold voltage during a read operation is between Vt and 2 Vt.

During the time that the gate threshold voltage is applied for a read operation to terminal 100, signal line 90 is grounded and the signal source 140 also applies the MRG* signal on line 80, which turns on transistor 10 and thereby applies power to the latch circuit 120. Note, MRG* may be set between Vcc minus a p-channel transistor Vt and 0 volts during normal operation. In a test mode it is lowered to provide a stronger pull up at node A to ensure adequate operating margin for the circuit. After power is applied, a signal is applied on line RDFUS* 110, which serves to turn on transistor 20 and turn off transistor 50. If at the time the RDFUS* signal is applied to turn on transistor 20, a voltage Vcc is produced at node A, then transistor 70 is turned "off."

The voltage at node A is inverted by inverter 60 and is applied at output node B as a low voltage, e.g., "0" volts.

On the other hand, if when the RDFUS* signal is applied and turns on transistor 20, transistor 70 is also turned "on" by the gate threshold voltage VPRGG on line 100 and the grounding of line 90, then the Vcc voltage applied at node A will be diverted to ground through transistor 70 and the drain of transistor 70 and line 90. Thus, the voltage at node A will be at a low voltage, e.g., substantially "0" volts which, after inversion by inverter 60, will be seen at node B as a high output, e.g., as substantially Vcc.

When the voltage at terminal A goes to a high voltage and transistor 70 is off, the high voltage at node A will produce a low voltage at node B which is, in turn, supplied to transistor 30, causing it to turn on and hold the voltage at node A at the high voltage, and the voltage at node B at a low value. The low voltage at node B will maintain transistor 40 off, and thus the operative state of transistor 50 does not affect operation of the latch circuit 120.

If when transistor 20 is turned on and transistor 50 is turned off by the RDFUS* signal on line 110, and if at that time programmable transistor 70 is turned on, this produce a low voltage at node A which, in turn, produces a high voltage at node B. The high voltage at node B turns transistor 40 on and transistor 30 off and, when the RDFUS* returns to its normal high state this turns on transistor 50, which latches node A at the low voltage which, in turn, latches node B at the high voltage.

Thus, during a read operation, the state of output node B of latch circuit 120 reflects the operative state of transistor 70, i.e., "on" or "off," which in turn reflects the programmed state of programmable transistor 70.

The application of the read gate threshold voltage VPRGG at a level between the two possible threshold voltages for transistor 70 can be done at the same time the RDFUS* signal is applied to line 110.

The invention provides a simple expedient of a program transistor as a programmable element and a simple latch circuit to determine the state of the programmable element. The voltages required to program the transistors are much less than those required to program a fuse or antifuse element.

The programmable circuit of the invention may be used in an environment which requires the use of programmable elements in an analog or digital semiconductor circuit, including but not limited to logic circuits, processors, other programmable logic circuits, and memory devices. The invention may particularly be useful in memory devices as a programmable element for providing identification codes and/or programming to re-map defective memory cell addresses. In particular, DRAM devices where a boosted word line voltage has been known to inadvertently produce Vf shifts in small n-channel transistors in the memory array. This boosted word line voltage may be used to generate either or both of the VPRGG and VPRGD signals.

Figure 3:
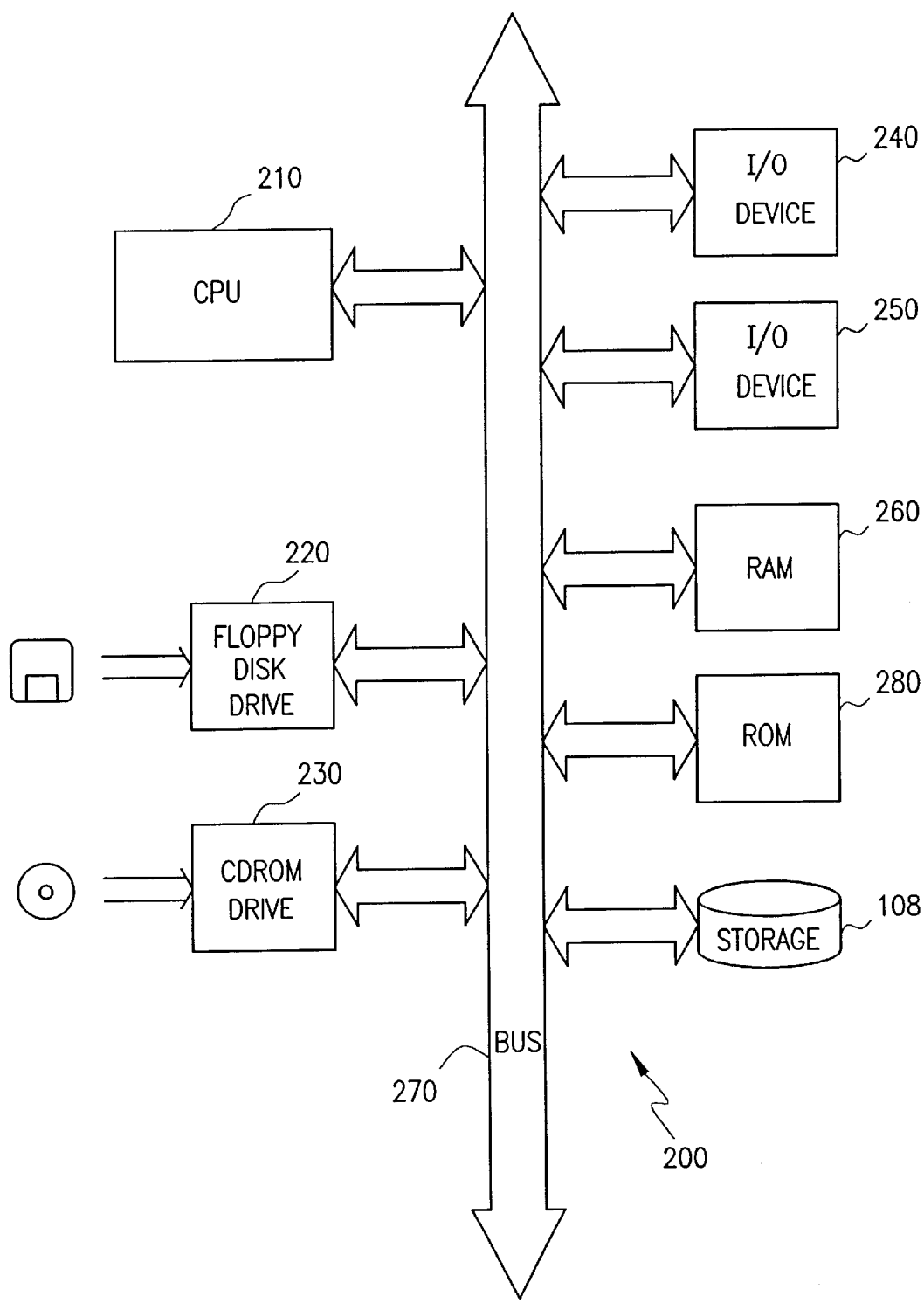
FIG. 3 illustrates a processor circuit which employs a memory device using the FIG. 1 circuit.

A processor system which may employ the programmable circuit of the invention is illustrated in FIG. 3. As shown in FIG. 3, the processor system, such as a computer system, for example, comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and may include peripheral devices such as a floppy disk drive 220 and a compact disk (CD) ROM drive 230 which also communicates with CPU 210 over the bus 270. One or more of the RAM 260, CPU 210, ROM 280 may be constructed as an integrated circuit which includes the programmable transistor 70 and latch circuit 120 as described above. It may also be desirable to integrate the processor 210 and memory 260 on a single IC chip. Numerous other system configurations are possible which are fully compatible with the present invention.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of operating a programmable circuit comprising:

causing a gate threshold voltage of a programmable transistor to move from one of a first voltage and a second voltage to the other of said first voltage and said second voltage by applying respective predetermined voltages to a gate and a drain terminal of said programmable transistor; and latching a latch circuit adapted to serve in place of a fuse or anti-fuse depending on said gate threshold voltage of said programmable transistor.

2. A switching device comprising:

a transistor having a source, a drain, and a gate;

a signal line operatively connected to said gate, said transistor adapted to provide a conductive path between said source and said drain in response to a first electrical signal applied on said signal line having a magnitude above an operating threshold magnitude, said operating threshold magnitude adapted to be modified from a first voltage to a second voltage in response to a second electrical signal applied between said drain and said gate; and a latch circuit having an input coupled to said source of said transistor and an output adapted to serve in place of an output of a fuse or anti-fuse.

3. A switching device as defined in claim 2, wherein said first voltage is a voltage of about 0.7 V, and said second voltage is a voltage of about 1.5 V.

4. A method of operating a programmable circuit comprising:

switchingly applying a programming voltage between a gate and a drain of a field effect transistor whereby an initial threshold voltage of said transistor is modified to a programmed threshold voltage of the transistor and the transistor is programmed into a programmed state;

applying a first test voltage to said gate of said transistor;

sensing a conductivity of said transistor; and latching a latch circuit coupled to a source of said transistor based on said conductivity of said transistor.

5. A method of operating a programmable circuit as defined in claim 4 wherein said sensing a conductivity comprises:

switchingly grounding said drain of said transistor;

sensing a voltage responsive to a current through said transistor; and detecting said programmed state of said transistor.

6. A method of operating a programmable circuit comprising:

applying a first test voltage to a gate of a field effect transistor and flowing a test current between a drain and a source of said transistor, said transistor adapted to exhibit one of at least a first and a second programmed state, such that a responsive voltage responsive to said test voltage and said test current appears across said transistor, said responsive voltage having a first magnitude if said transistor exhibits said first programmed state and a second magnitude if said transistor exhibits said second programmed state; and causing said transistor to transition from said first programmed state to said second programmed state by applying a programming voltage between said drain and said gate of said transistor.

7. A method of operating a programmable circuit as defined in claim 6 further comprising:

applying said responsive voltage to an input of a latching circuit coupled in series with said transistor;

stopping said test current; and indicating whether said transistor exhibits said first programmed state or said second programmed state after stopping said test current.

8. A method of operating a programmable circuit comprising:

applying a first test voltage between a gate and a drain of a field effect transistor and a second test voltage between said drain and a source of said transistor, said transistor adapted to exhibit one of at least two programmed states, such that a responsive current responsive to said first and second test voltages flows through said transistor, said responsive current having a first magnitude if said transistor exhibits a first programmed state of said at least two states and a second magnitude if said transistor occupies a second programmed state of said at least two states; and causing said transistor to transition from said first programmed state to said second programmed state by applying a third programming voltage between said drain and said gate of said transistor.

9. A method of operating a programmable circuit as defined in claim 8 further comprising:

applying said responsive current to a latching circuit so as to record whether said transistor occupies said first programmed state or said second programmed state.

10. A method of operating a programmable circuit comprising:

providing first and second field effect transistors having substantially identical initial threshold voltages;

switchingly applying a programming voltage between a first gate of said first transistor and a first drain of said first transistor, whereby said initial threshold voltage of said first transistor is modified to a programmed threshold voltage, whereby said first transistor is programmed;

applying a first test voltage between said first gate and said first drain of said first transistor;

applying said first test voltage between a second gate and a second drain of said second transistor; and sensing respective conductivities of said first and second transistors to indicate that said first transistor is programmed and said second transistor is not programmed.

11. A method of operating a programmable circuit as defined in claim 10 wherein said sensing said respective conductivities comprises:

applying a second test voltage between a first source and said first drain of said first transistor;

applying said second test voltage between a second source and said second drain of said second transistor; and sensing first and second currents responsively flowing through said first and second transistors respectively to detect a first magnitude of said first current and a second magnitude of said second current, said first magnitude differing from said second magnitude to indicate that said first transistor is programmed and said second transistor is not programmed.

12. A method of operating a programmable circuit as defined in claim 10 wherein said first test voltage comprises a voltage between said initial threshold voltage of said first transistor and said programmed threshold voltage of said first transistor.

13. A method of operating a programmable circuit comprising:

charging a directly externally coupled gate of a field effect transistor from a first electrical potential to a second electrical potential with respect to a channel region of said transistor whereby said directly externally coupled gate is modified so that an initial threshold voltage of said transistor is modified to a programmed threshold voltage of the transistor and the transistor is programmed into a programmed state;

applying a first test voltage to said directly externally coupled gate of said transistor; and detecting said programmed state of said transistor.

14. A method of operating a programmable circuit as defined in claim 13 wherein said detecting said programmed state comprises:

applying a second test voltage between a source and a drain of said transistor;

sensing a responsive current through said transistor; and detecting said programmed state of said transistor.

15. A method of operating a programmable circuit as defined in claim 13 wherein said charging said gate of said transistor comprises:

switchingly applying a programming voltage between said gate and a drain of said transistor.

16. A method of operating a programmable circuit as defined in claim 13 wherein said charging said gate of said transistor comprises:

switchingly applying a programming voltage between said gate and a substrate of said transistor.

17. A method of operating a programmable circuit as defined in claim 13 further comprising:

applying a voltage of about 6 volts relative to ground to said gate;

applying a voltage of about 4.5 volts relative to ground to said drain; and applying a voltage of about −0.2 volts relative to ground to a substrate of said transistor to program said transistor.

* * * * *

UNITED STATES PATENT AND TRADEMARK OFFICE
CERTIFICATE OF CORRECTION

PATENT NO.     : 6,606,264 B2
DATED          : August 12, 2003
INVENTOR(S)    : Greg A. Blodgett It is certified that error appears in the above-identified patent and that said Letters Patent is hereby corrected as shown below:

Column 7,
Line 17, "charging" should read -- electrically charging --; and
Line 20, "externally a" should read -- externally --.

Signed and Sealed this

Twenty-second Day of June, 2004

JON W. DUDAS
*Acting Director of the United States Patent and Trademark Office*